United States Patent [19]
Collins et al.

[11] 4,377,006
[45] Mar. 15, 1983

[54] IR REMOTE CONTROL SYSTEM

[75] Inventors: Johnny Collins, Oak Park; Melvin C. Hendrickson, Elmhurst, both of Ill.

[73] Assignee: Zenith Radio Corporation, Glenview, Ill.

[21] Appl. No.: 57,053

[22] Filed: Jul. 12, 1979

[51] Int. Cl.³ .................................................. H04B 9/00
[52] U.S. Cl. .................................... 455/603; 307/234;
329/104; 329/107; 371/70; 375/21; 375/80;
375/94; 455/608
[58] Field of Search ...................... 375/21, 117, 80, 94;
455/603, 608, 617, 619; 329/102, 104, 106, 107,
108; 307/232, 234, 518; 340/167 R, 167 A;
371/70; 358/194.1

[56] References Cited
U.S. PATENT DOCUMENTS

| | | | |
|---|---|---|---|
| 3,340,506 | 9/1967 | Maygr | 371/70 |
| 3,624,603 | 11/1971 | Delcomyn | 371/70 |
| 3,717,769 | 2/1973 | Hubbard et al. | 455/608 |
| 3,934,131 | 1/1976 | Perschy | 371/70 |
| 3,973,212 | 8/1976 | Walloch | 329/104 |
| 3,976,996 | 8/1976 | Wu | 375/80 |
| 4,112,383 | 9/1978 | Burgert | 329/106 |
| 4,143,368 | 3/1979 | Route et al. | 455/603 |

OTHER PUBLICATIONS

Casier et al.—A PPM Transmission System for Remote Control of a TU Set–IEEE Jour. of Solid State Circuit, vol. SC-11, #6, pp. 801-808, Dec. '76.

*Primary Examiner*—Joseph A. Orsino, Jr.
*Attorney, Agent, or Firm*—Jack Kail

[57] ABSTRACT

A remote control system for a television receiver includes a transmitter and a receiver, the transmitter being adapted for transmitting a multibit code identifying a selected function of the television receiver wherein the data bits forming the multibit code each comprise a single pulse representing a first logic state and a grouping of at least two relatively closely spaced pulses representing a second logic state. The remote control receiver includes a self-clocking detector for converting the transmitted pulses to a binary logic signal and decoding means responsive to the logic signal for operating the selected television receiver function.

14 Claims, 7 Drawing Figures

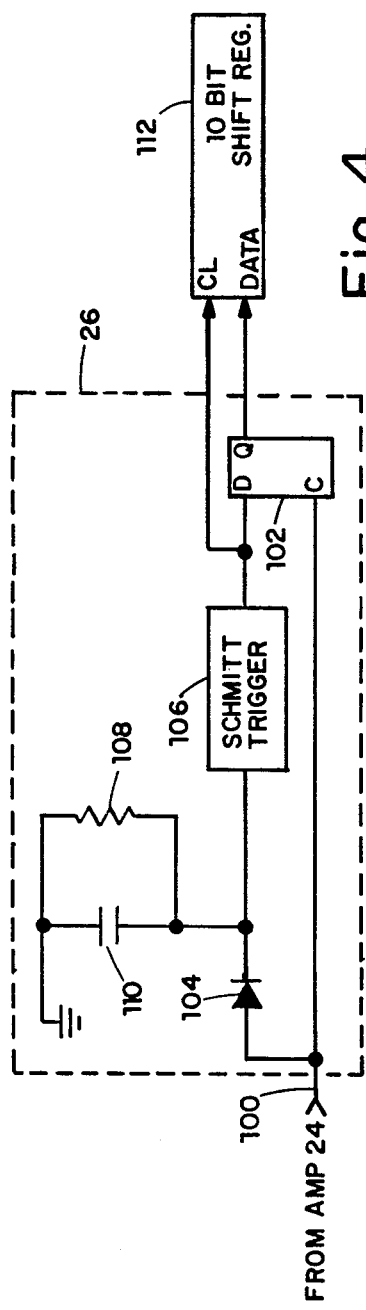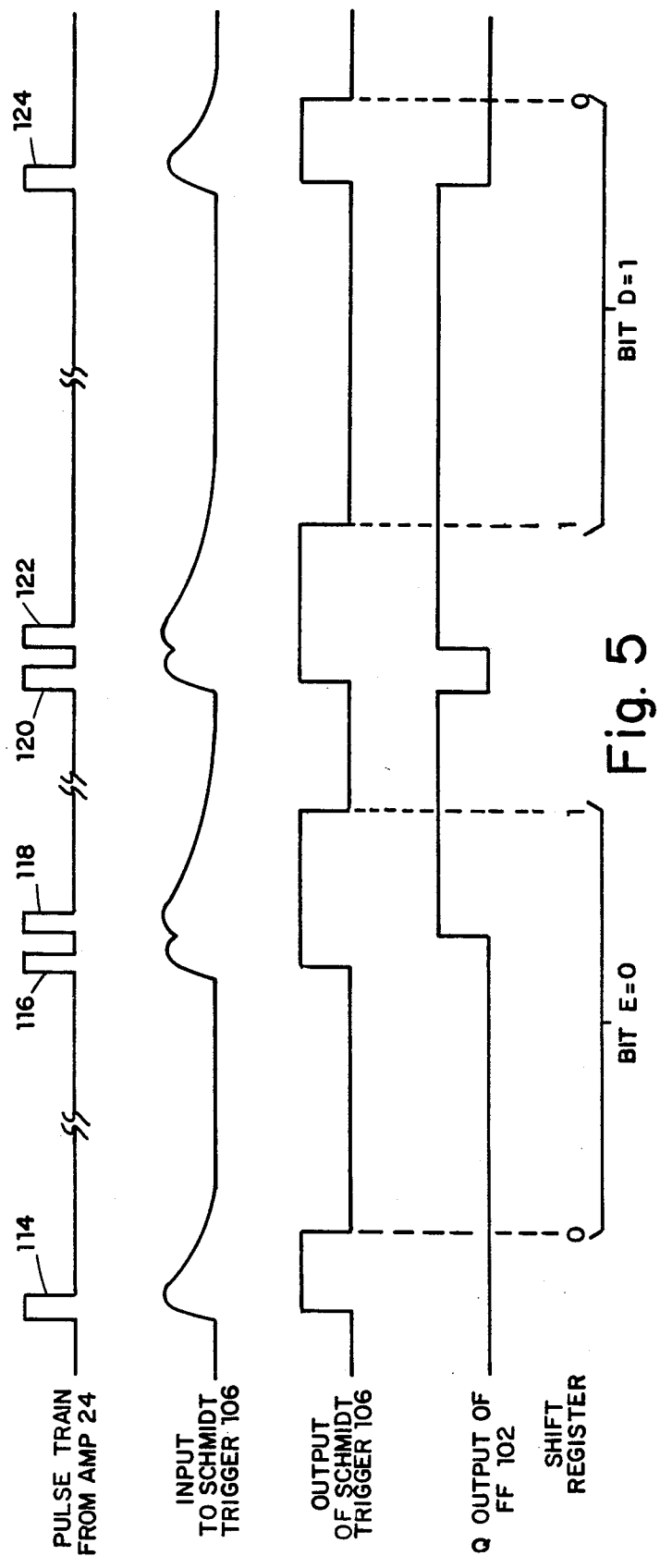

IR REMOTE CONTROL SYSTEM

BACKGROUND OF THE INVENTION

The present invention relates in general to remote control systems and, in particular, to a remote control system for controlling selected functions of a television receiver.

Remote control systems for television receivers normally comprise a battery-powered, hand-held transmitter which encodes and transmits selected keyboard information and a receiver which decodes the transmitted information and generates the necessary control signals for operating the selected functions of the television receiver. Most such systems employ an ultrasonic transmission feature wherein the keyboard information is transmitted as a suitably modulated sound wave or, alternatively, utilize a transmission system operable in the infrared region of the spectrum for transmitting data at the speed of light.

Ultrasonic remote control systems, although extensively used in the prior art, exhibit various inherent limitations which are especially undesirable when considered in connection with the operation of a television receiver. Initially, due to the relatively narrow width of the frequency band employed, only a limited number of controllable functions may be accommodated by the system. Also, ultrasonic systems normally operate rather poorly for rejecting ambient noise in the ultrasonic spectrum and are quite sensitive to room reflections for initiating undesired remote control operations. In an effort to overcome these problems, there has been a recent tendency toward the increased use of infrared transmission systems. Such systems typically accommodate an increased number of controllable functions and can be designed for exhibiting less sensitivity to ambient noise than the ultrasonic systems.

In order to distinguish between selected keyboard information as well as to provide a degree of immunity from ambient noise, the transmitted infrared signals are typically encoded in a precise manner using any of a number of well known techniques, most of these techniques necessitating the use of highly stable crystal oscillators or the like which must be properly adjusted to facilitate accurate measurements of time or frequency. Exemplary of these techniques are various known forms of pulse position modulation and pulse width modulation. U.S. Pat. No. 3,928,760 to Isoda discloses another technique in which a remote control light signal is amplitude modulated by a modulating frequency in the ultrasonic range, the modulating frequency subsequently being detected for controlling a selected function. In U.S. Pat. No. 3,906,366 to Minami et al., a remote control system is disclosed in which a transmitted remote control signal is characterized by a gradually variable duty cycle. The receiver is adapted for discriminating the received signal depending on its frequency for identifying the function to be controlled while the duty cycle is detected for allowing the controlled function to be continuously and gradually operated. U.S. Pat. No. 3,866,177 to Kawamata et al. discloses another remote control system in which a high frequency remote control signal is chopped with a lower frequency signal. The receiver includes a plurality of tuned circuits each responsive to a different high frequency signal and means for integrating several cycles of the lower frequency signal for activating a selected function.

It will thus be appreciated that each of the above systems employs means for discriminating a transmitted remote control signal on the basis of frequency or some other relatively precise time relationship. As a result, tuned circuits, synchronized clock generators or other similar devices which frequently require adjustment and add to the cost and complexity of the system are normally required to enable the transmitted signals to be properly decoded. Parity testing is another technique commonly used to verify the accuracy of a transmitted signal. For example, it is known to transmit a parity bit following the transmission of an encoded sequence of information pulses or to count the number of transmitted bits of information to verify that an odd or even number of bits have been transmitted. It is also known to transmit redundant signals to increase confidence in the accuracy of the system. It is a primary object of the present invention to provide an infrared remote control system capable of operation over a wide range of system variables and not requiring the use of timing circuits for detecting precise time and frequency relationships. It is a further object of the invention to provide a remote control system of this type which employs a novel parity checking technique.

BRIEF DESCRIPTION OF THE DRAWINGS

FIG. 4 is a block diagram illustrating the detector of the receiver shown in FIG. 1.

FIG. 5 illustrates various waveforms depicting the operation of the detector circuit shown in FIG. 4.

DESCRIPTION OF THE PREFERRED EMBODIMENT

Figure 1:
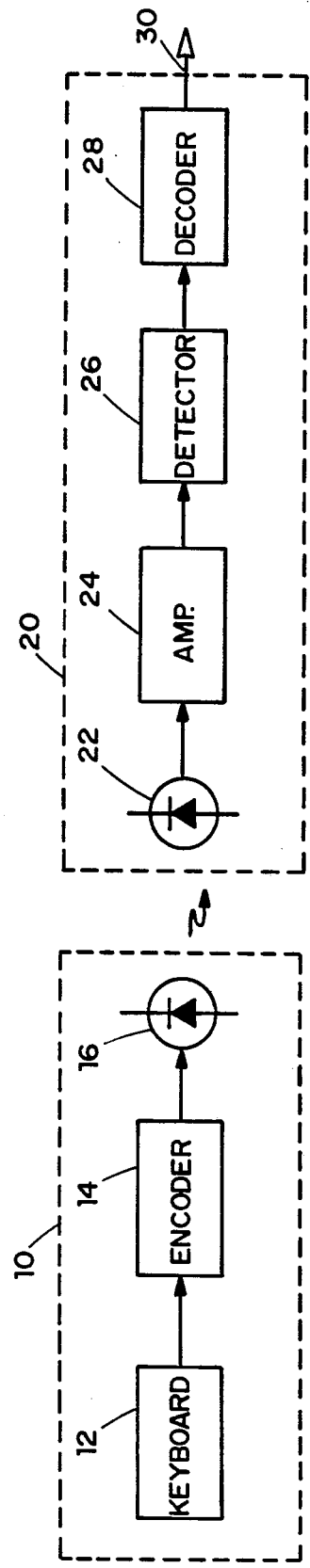
FIG. 1 is a block diagram showing the basic operation of a remote control system including the invention.

Referring to FIG. 1, a remote control system according to the present invention basically comprises a transmitter 10 including a keyboard 12, an encoder 14 and a infrared light emitting diode 16. The remote control system further comprises a receiver 20 including a photo diode 22, an amplifier 24, a detector 26, a decoder 28 and a plurality of output conductors 30.

In operation, a controllable television receiver function, e.g. power on-off, volume up-down, mute, etc., is selected for operation by depressing a corresponding key or keys on keyboard 12 of the transmitter 10. Encoder 14 is responsive to the depressed keys for generating a special code uniquely identifying the selected function, which code is transmitted as an infrared remote control signal by diode 16. The transmitted code is received by photo diode 22 of receiver 20 and coupled by amplifier 24 to detector 26. Detector 26 converts the transmitted specially coded signal into a corresponding binary logic signal which is decoded by decoder 28. Decoder 28, in turn, energizes one of the plurality of output conductors 30 for operating the selected television receiver function.

Figure 2:
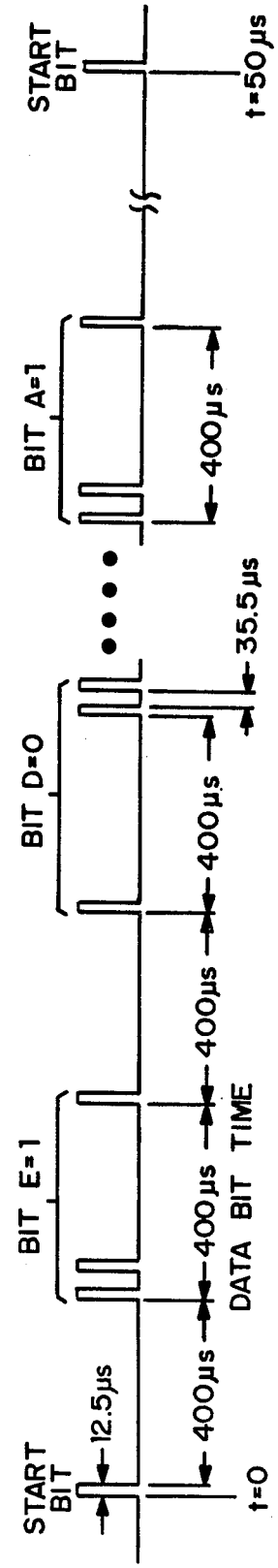
FIG. 2 illustrates the technique used by the transmitter of FIG. 1 to encode the transmitted remote control signal.

The special code generated by encoder 14 is illustrated in FIG. 2. Each controllable television receiver function is uniquely identified by a particular five bit data word allowing for the unambiguous control of 32 different functions. However, if control of more than 32 different functions is desired, the bit size of the data word may be increased as necessary. In the five bit example shown in FIG. 2, each data word initially comprises a start bit composed of a single pulse having a pulse width of about 12.5 μsecs. The purpose of the start bit is to initialize the operation of receiver 20 for processing the subsequently transmitted multibit code. Each of the five data bits of the multibit code transmitted after the start bit consists of a pattern of three spaced pulses, each pulse also being about 12.5 μsecs wide. The pulses comprising each data bit are arranged such that a grouping of two closely spaced pulses occur first followed later by a single pulse or a single pulse occurs first followed later by a grouping of two closely spaced pulses. The logical state of each data bit is defined by the first occuring pulse or pulses during each data bit time, the later occurring pulse or pulses being used by detector 26 as a parity check to provide increased confidence that a proper signal has been received. In particular, each grouping of two closely spaced pulses represents a logic state of 1 whereas each single pulse represents a logic state of 0.

Referring to FIG. 2, it will be seen that the initial data bit transmitted after the start bit, i.e. bit E, respresents a logical 1 in that a grouping of two closely spaced pulses occur first during the data bit time. The single pulse occurring at the end of the data bit time represents a logical 0 but is used only as a parity check against the logic state of the data bit. The next data bit, bit D, is initially composed of a single pulse and therefore represents a logical 0 value. Again, the subsequently occurring two pulse grouping represents the complementary logic state, logical 1, and is used for checking parity against the state of the data bit. The remaining three bits of the multibit code are similarly constructed such that each five bit code comprises 16 spaced pulses. Preferably, the data bit time for each data bit is approximately 400 μsecs although deviations of up to ±50% from this value may be accommodated by the system. The time between the successive start bits is preferably on the order of about 50 ms so that the transmitted code the system. The time between the successive start bits is preferably on the order of about 50 ms so that the transmitted code is characterized by a low duty cycle not appreciably draining the transmitter battery.

Figure 3:
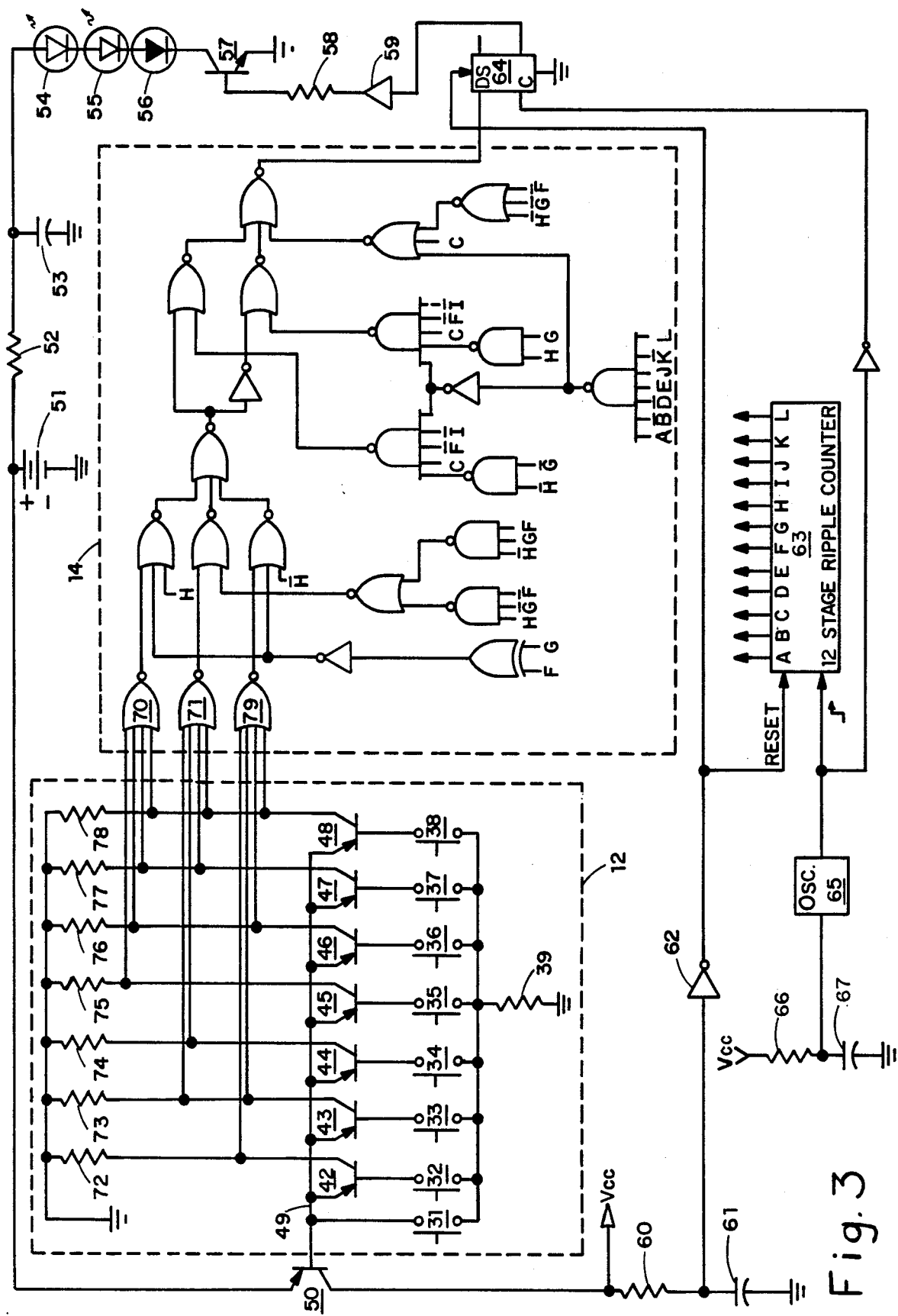
FIG. 3 is a schematic diagram showing an embodiment of the transmitter of FIG. 1.

FIG. 3 schematically illustrates an eight function transmitter configured for selectively developing and transmitting the narrow pulses representing the previously described multibit code. The transmitter includes a keyboard 12 having eight key switches 31-38, the depression of each key switch causing a different pattern of pulses representing a particular code to be developed at the output of encoder 14 for activating an associated television receiver function. Each of the key switches 31-38 includes a first terminal connected to a source of ground potential through a resistor 39, a second terminal and a key, the keys normally being biased in the position shown and operable for conductively connecting the first and second terminals of each respective switch 31-38. Each of the second terminals of the key switches 31-38 are connected to the base of a PNP transistor 42-48 respectively, the second terminal of key switch 31 being connected to a conductor 49 which couples the emitters of transistors 42-48 to the base of a further PNP transistor 50. The collectors of transistors 42-48 are each connected by a respective resistor 72-78 to a source of ground potential. The emitter of transistor 50 is connected to the positive terminal of a 9 volt transistor battery 51 and through a resistor 52 to one plate of a capacitor 53, the other plate of capacitor 53 being connected to ground. The ungrounded plate of capacitor 53 is coupled through three series connected infrared light emitting diodes 54-56 to the collector of an NPN transistor 57. The base of transistor 57 is coupled by a resistor 58 and a driver amplifier 59 to the output of encoder 14 while the transistor's emitter is connected to ground.

The collector circuit of transistor 50 includes a series RC circuit comprising a resistor 60 and a capacitor 61. The junction formed between resistor 60 and capacitor 61 is connected through an inverter 62 to the reset inputs of a 12-stage ripple counter 63 and a shaping flip-flop 64 whose D-input is derived from the output of encoder 14. Both counter 63 and flip-flop 64 are clocked in response to a clock signal developed at the output of an oscillator 65 biased by the voltage developed at the junction of a resistor 66 and a capacitor 67. The other end of resistor 66 is connected to the collector of transistor 50 at which is developed a positive potential which, in addition to supplying a positive potential for biasing oscillator 65, is also used to suitably bias the logic currents of encoder 14. While oscillator 65 is preferably operated at a nominal frequency of about 80 Khz, the system has been found to perform adequately over an oscillator frequency range extending as low as 60 Khz and as high as 100 Khz.

Encoder 14 comprises a plurality of logic gates connected to the collectors of transistors 42-48 and to the outputs $Q_A$-$Q_L$ of counter 63 as shown. Operation of one of the switches 31-38 renders transistor 50 conductive whereby power is supplied to oscillator 65 for operating counter 63 whose 12 outputs $Q_A$-$Q_L$ sequentially assume logical 1 and 0 states in a well known manner. Also, depending upon which of the switches 31-38 is operated, one of the collectors of transistors 42-48 or the second terminal of switch 31 will go logically high. For example, if switch 31 is operated, transistor 50 is rendered conductive such that its base together with switch 31 assume nearly the supply voltage characterizing battery 51. On the other hand, if one of the switches 32-38 is operated, its associated one of the transistors 42-48 along with transistor 50 are both rendered conductive such that the collector of the transistor associated with the operated switch goes logically high while the collectors of the other transistors remain logically low. Encoder 14 includes three input NOR gates 70, 71 and 79 whose outputs are dependent upon the states of transistors 42-48 and thereby upon the operation of switches 31-38. That is, due to the manner of interconnection of the inputs of NOR gates 70, 71 and 79 with the collectors of transistors 42-48, a different logic output is developed by the gates in response to the operation of each of the switches; operation of switch 31 causing the outputs of NOR gates 70, 71 and 79 exhibit logic signals 111, operation of switch 32 causing the output logic signals to assume the voltages 110, operation of switch 33 causing the output logic signals to assume the values 100, and so on. The remaining logic gates of encoder 14 combinatorally process the outputs of NOR gates 70, 71 and 79 together with the outputs of counter 63 such that the output coupled to the D-input of flip-flop 64 comprises a repeating 16 pulse signal representing a five bit code in conformity with that illustrated in FIG. 2. This 16 pulse signal is shaped by flip-flop 64 and coupled through amplifier 59 and resistor 58 to the base of transistor 57. Transistor 57 is driven into conduction in response to each pulse whereby diodes 54–56 emit a corresponding infrared signal. Capacitor 53 is provided to enable the supply of about one ampere of current through the diodes even though only a small capacity battery 51 is employed.

While the foregoing description of transmitter 10 was in terms of an eight function device, it will be readily apparent that similar, although somewhat more logically complex, circuitry can be used to effect a transmitter having a greater number of functions. In such a transmitter it may be more convenient to employ a scanned keyboard of the type readily available from a number of well known commercial sources.

The pulses generated by diode 16, and arranged for representing a five bit binary code corresponding to an operated key of keyboard 12, are received by receiver 20 and coupled from diode 22 through amplifier 24 to the input of detector 26. Detector 26, which significantly comprises a key aspect of the invention, is self-clocking, i.e. requires no input signal other than the transmitted pulse code, and relies on neither frequency nor period counting for detecting the transmitted remote control signal.

Detector 26 is shown in detail in FIG. 4 as comprising an input terminal 100 coupling the received pulse train from amplifier 24 to the clock input of a D flip-flop 102 and through a diode 104 to the inputs of a Schmitt Trigger circuit 106 (whose use is optional) and an integrating circuit composed of a resistor 108 connected in parallel with a capacitor 110. The output of Schmitt Trigger circuit 106 is connected to the clock input of a negative edge triggered ten bit shift register 112 and to the D input of flip-flop 102, the Q output of flip-flop 102 being connected to the serial data input of the shift register.

FIG. 5 illustrates the operation of detector 26 and initially shows a portion of the pulse train developed at the output of amplifier 24. The portion of the pulse train shown in FIG. 5 represents two data bits, the first data bit comprising a single pulse 114 followed by a grouping of two pulses 116 and 118 and the second data bit comprising a group of two pulses 120 and 122 followed by a single pulse 124. From the previous discussion, it will be recalled that pulses 114, 116 and 118 represent a logical 0 data bit while pulses 120, 122 and 124 represent a logical 1 data bit.

The integrated pulses applied to the input of Schmitt Trigger 106 and the signal developed at the output of the Schmitt Trigger are illustrated by the second and third waveforms of FIG. 5. The fourth waveform of FIG. 5 represents the state of the Q output of flip-flop 102 which is derived as follows. Flip-flop 102 is initially clocked by the positive going edge of pulse 114. Due to the effect of integrating the pulse train from amplifier 24 by capacitor 110 and the forward diode resistance of diode 104, the D input of flip-flop 102 is still logically low at this time so that the Q output of the flip-flop assumes a value of logical 0. Flip-flop 102 is next clocked by the positive edge of pulse 116 which also coincides with a logical 0 output of Schmitt Trigger 106. The Q output of flip-flop 102 consequently remains at logical 0. However, at the positive edge of pulse 118, the output of Schmitt Trigger 106 is at logical 1 so that the Q output of flip-flop 102 assumes a logical 1 value. It will be appreciated that the output of Schmitt Trigger 106 coinciding with the positive edge of pulse 118 is at a logical 1 level due to the effect of integrating the two closely spaced pulses 116 and 118. Thus, in general terms, it will be seen that the Q output of flip-flop 102 will assume or remain at a logical 0 value in response to the positive edge of a single pulse of the pulse train and will assume a logical 1 value in response to the positive edge of the second pulse of each two pulse grouping of the pulse train. Accordingly, the Q output of flip-flop 102 assumes a logical 1 value in response to the positive edge of pulse 122 and assumes a logical 0 value in response to the positive edge of pulse 124.

Shift register 112 clocks data from the Q output of flip-flop 102 to its serial data input in response to negative transitions of the signal developed at the output of Schmitt Trigger 106. Therefore, referring to FIG. 5, the following binary bits are sequentially clocked into shift register 112 in response to the exemplary pulse train portion: 0-1-1-0. As discussed previously, the first two binary bits represent a logical 0 data bit while the last two binary bits represent a logical 1 data bit. Of course, in response to the complete reception of a five data bit code, the shift register 112 would sequentially be loaded with 10 binary bits forming a binary logic signal representative of the function of the television receiver selected for operation on keyboard 12.

Upon receiving and detecting the five transmitted data bits, in the form of a ten bit binary logic signal, the receiver 20 next determines whether the received code is valid, enables the selected function and disables the function upon cessation of the code. These latter functions are performed by the circuitry of receiver 20 illustrated in FIG. 6.

Figure 6:
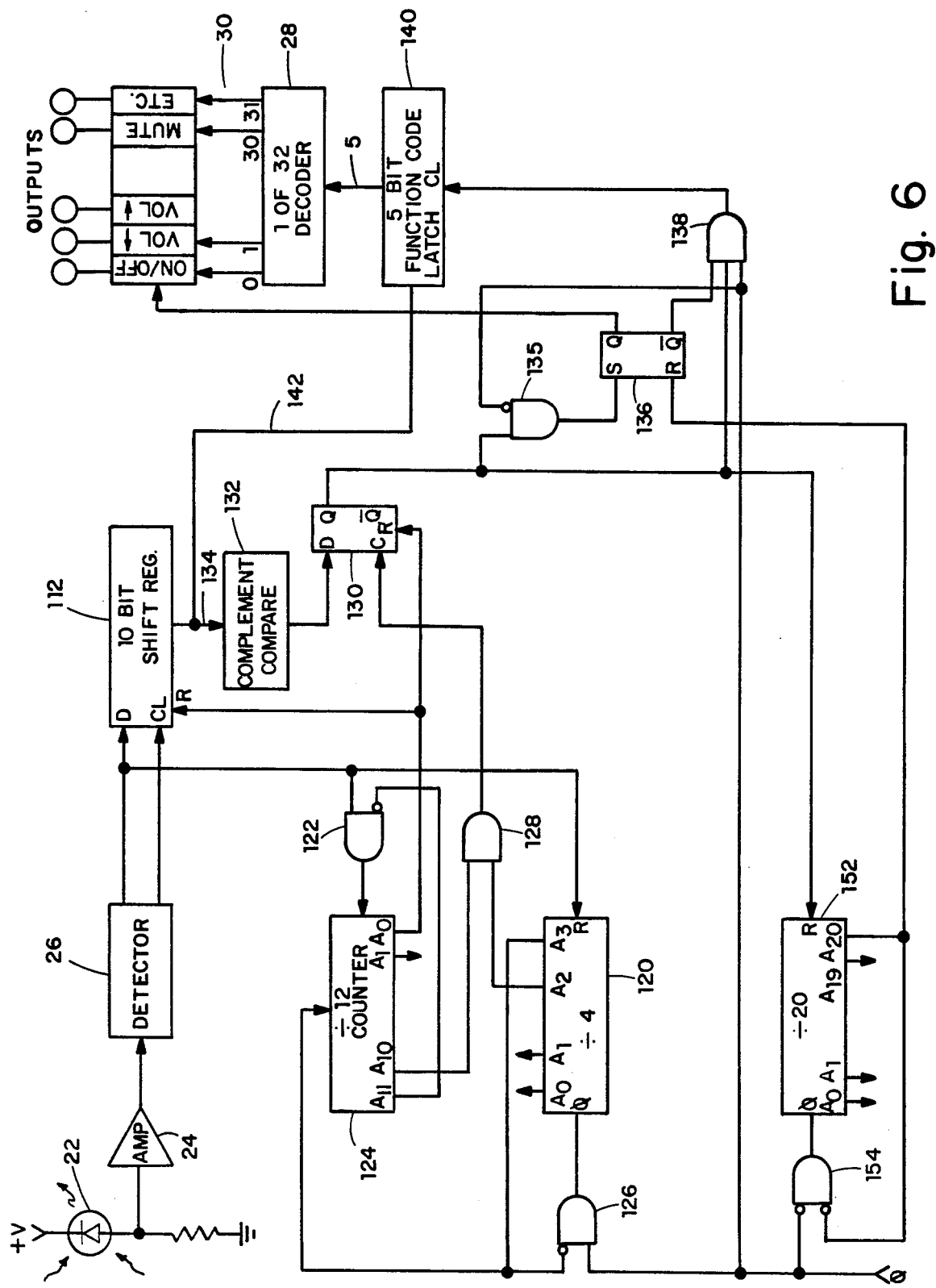
FIG. 6 is a detailed block diagram illustrating the receiver shown generally in FIG. 1.

Referring to FIG. 6, the start pulse of a transmitted code is coupled from detector 26 for resetting an End of Word timer comprising a divide by four counter 120. Counter 120 comprises a conventional binary counter including two flip-flop stages and a decoding circuit configured for energizing a different one of the counter's outputs $A_0$–$A_3$ in response to each state of the two flip-flops. Thus, the outputs $A_0$–$A_3$ of the counter 120 are sequentially energized, one at a time, as the flip-flop stages sequence through the states 00, 01, 10 and 11. A counter of this type, i.e. wherein each counter state is represented by the energization of only a single output line, will hereinafter be referred to as a decimally decoded binary counter and is commercially available as RCA part number CD4017A.

Counter 120 is clocked in response to the output of an AND gate 126 whose inputs comprise a clock signal $\phi$, preferably 120 Hz, and the inverted $A_3$ output of the counter.

The start pulse is also coupled through an AND gate 122 for clocking a divide by twelve decimally decoded binary counter 124. Counter 124 is reset in response to the $A_3$ output of counter 120, the inverted $A_{11}$ output of counter 124 representing a count of eleven, being coupled to the second input of AND gate 122. The $A_{10}$ output of counter 124 together with the $A_2$ output of counter 120 are coupled through an AND gate 128 whose output is connected to the clock input of a valid signal flip-flop 130. Also, the $A_0$ output of counter 124 is connected to the reset inputs of shift register 112 and flip-flop 130.

In operation, the start pulse of a transmitted code resets counter 120 and clocks counter 124 thereby resetting shift register 112 and valid signal flip-flop 130. If counter 124 has assumed a count of ten, indicating that a complete code has been transmitted, when the $A_2$ output of counter 120 goes high, AND gate 128 is operated for clocking valid signal flip-flop 130. The D input of flip-flop 130 is connected to a complement compare circuit 132 comprising a series of EXCLUSIVE OR gates connected to a ten conductor bus 134 for comparing each adjacent pair of binary logic bits stored in shift register 112. In other words, complement compare circuit 132 is operative for comparing the logic state represented by the first occurring pulse or pulses of each data bit of the transmitted code to the logic state represented by the next occurring pulse or pulses of the respective data bit as a confidence check insuring that a valid signal has been transmitted. If the comparison is true and output $A_{10}$ of counter 124 is high, denoting 10 bits of code have been received, a logical 1 is latched into valid signal flip-flop 130 in response to the $A_2$ output of End of Word timer 120 going logically high.

The Q output of valid signal flip-flop 130 is coupled through an AND gate 135 to the set input of a function enable flip-flop 136, the Q output of flip-flop 136 being coupled for enabling the various controllable functions of the television receiver. The second input of AND gate 135 is supplied with clock signal $\overline{\phi}$. Clock signal $\phi$ together with the Q output of the valid signal flip-flop 130 and the $\overline{Q}$ output of function enable flip-flop 136 are coupled through an AND gate 138 for clocking a five bit function code latch 140. The data inputs of latch 140 are derived from a five conductor bus 142 connected to the even numbered stages of shift register 112 on whose outputs are developed five binary bits representative of the data bits comprising the transmitted multibit code. The five outputs of latch 140 are coupled by a 1 of 32 decoder 28 for controlling the operation of a selected function of the television receiver.

As previously described, valid signal flip-flop 130 develops a Q=1 output when confidence has been achieved in the integrity of a received code. As a consequence, function enable flip-flop 136 is set enabling the desired function as selected by 1 of 32 decoder 28 in response to the function code clocked into and stored in latch 140.

The Q=1 output of valid signal flip-flop 130 also serves to reset a signal drop out timer comprising a divide by twenty decimally decoded binary counter 152. Counter 152 is clocked by the output of an AND gate 154 whose inputs comprise clock signal $\overline{\phi}$ and the inverted $A_{20}$ output of the counter. The $A_{20}$ output of the counter is also connected to the reset input of function enable flip-flop 136. If a valid signal is not present after a predetermined time (measured by the $A_{20}$ output of counter 152 going logically high) as indicated by the Q output of valid signal flip-flop 130 going logically high, counter 152 is effective for resetting function enable flip-flop 136 terminating actuation of the previously operated function.

Figure 7:
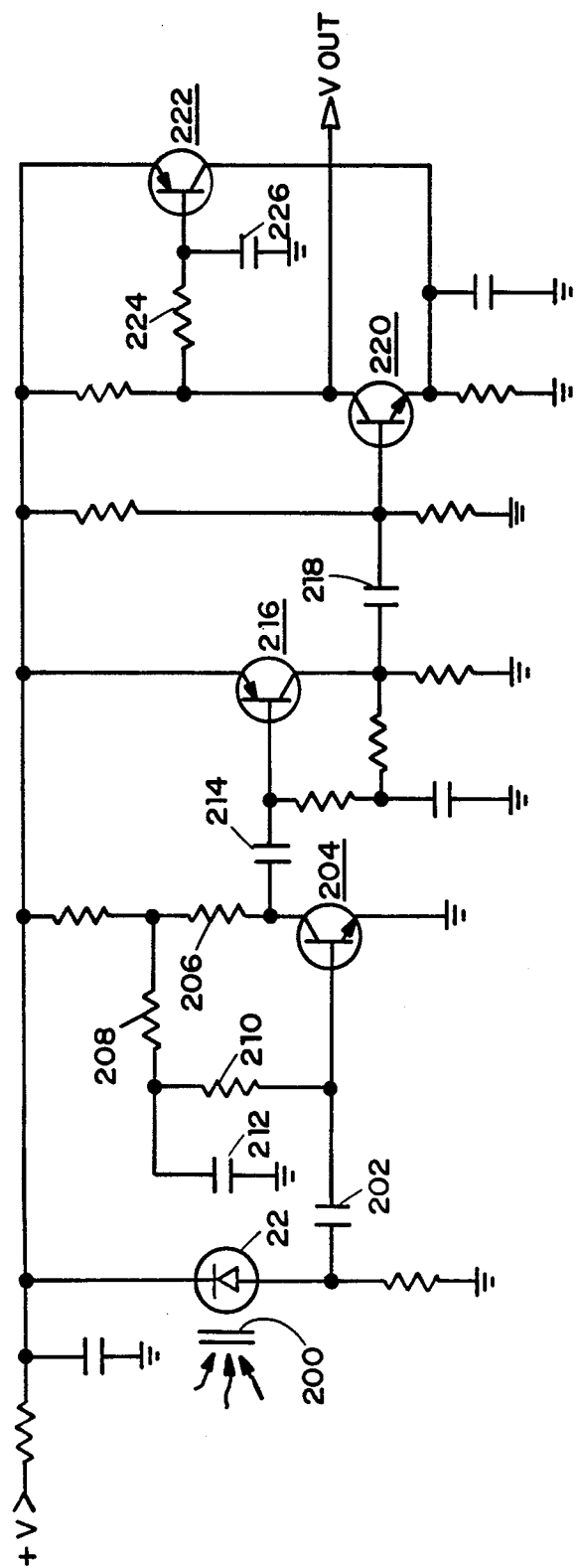
FIG. 7 is a schematic diagram illustrating a preferred form of the amplifier of the receiver shown in FIG. 1.

A preferred embodiment of amplifier 24 is illustrated in FIG. 7. The signal emanating from transmitter 10 is initially filtered by an IR optical fiber 200 to reduce 60 Hz interference from incandescent and fluorescent bulbs. The filtered signal is developed across diode 22 and coupled via a capacitor 202 to the base of an NPN transistor 204, capacitor 202 providing additional 60 Hz attenuation. A D.C. stabilizing network comprising resistors 208 and 210 and a capacitor 212 is connected between the collector and base of transistor 204. The stabilizing network essentially serves to reduce the gain of transistor 204 to 60 Hz noise but not for the narrow signal code pulses. The signal developed at the collector of transistor 204 is then coupled by a capacitor 214 to the base of a PNP transistor 216 which includes a stabilizing network operable substantially in the same manner as that associated with transistor 204. The collector of transistor 216 is connected by a coupling capacitor 218 to an output NPN transistor 220. The signal developed at the collector of transistor 220 forms the output of amplifier 24 coupled to detector 26.

An automatic threshold setting transistor 222 is connected in the output stage of amplifier 24, the collector of transistor 222 being connected to the emitter of output transistor 220 and the base of transistor 222 being connected via a filter circuit, consisting of a resistor 224 and a capacitor 226 to the collector of transistor 220. The basic purpose of transistor 222 is to automatically set a threshold value below which transistor 220 will not turn on so as to clip any noise which would otherwise be developed at the output of the amplifier. In particular, as transistor 220 begins to draw current, the voltage at its collector is reduced causing transistor 222 to supply current from its collector to the emitter of transistor 220. The emitter voltage of transistor 220 is consequently raised setting a threshold level which must be exceeded by the input signal before the transistor can conduct.

What has thus been shown is an improved infrared remote control system which is operable over a wide range of system variables and which requires no specially adjusted circuits for performing precise frequency and time measurements. The receiver portion of the system is particularly adapted for use in association with a microprocessor.

What is claimed is:

1. A remote control system comprising a transmitter and a receiver, said transmitter comprising means for transmitting a succession of pulses arranged for selectively forming a multibit code wherein a single pulse is representative of a first logic state data bit and a grouping of at least two relatively closely spaced pulses is representative of the complementary logic state data bit, said receiver comprising means for receiving the transmitted pulses from said transmitter, means for integrating said received pulses, a D-type flip-flop, a multibit shift register and circuit means coupling said received pulses from said integrating means to the D input of said flip-flop and to the clock input of said shift register, the clock input of said flip-flop being connected for directly receiving said received pulses and the Q output of said flip-flop being connected to the serial data input terminal of said shift register, whereby a logic signal is loaded in said shift register representing said multibit code in terms of said first logic state data bit and said complementary logic state data bit.

2. The remote control system of claim 1 wherein said means for transmitting and said means for receiving are operative in the infrared spectrum.

3. The remote control system of claim 1 wherein said transmitter includes additional means for transmitting one of said groupings of at least two relatively closely spaced pulses in time succession following the transmission of one of said single pulses and for transmitting one of said single pulses in time succession following the transmission of one of said groupings of at least two relatively closely spaced pulses, said multibit code including said additionally transmitted pulses.

4. The remote control system of claim 4 wherein said receiver includes means for testing the parity of each successive pair of the logic data bits of said logic signal.

5. The remote control system of claim 4 wherein said receiver includes means responsive to said parity testing means and to one of the logic data bits of each successive pair of logic data bits for decoding said logic signal representing said multibit code.

6. A remote control system for remotely controlling selected functions of a television receiver comprising:
   A. a transmitter comprising
      a keyboard for selecting a function of said television receiver to be controlled;
      encoding means responsive to said keyboard for developing a multibit code identifying the selected function, wherein the data bits forming said multibit code comprise a single pulse representing a first logic state and a grouping of at least two relatively closely spaced pulses representing the complementary logic state; and
      means for successively transmitting the data bits of said multibit code as represented by said pulses in the infrared region of the spectrum; and
   B. a receiver comprising
      means for receiving the pulses comprising said transmitted multibit code;
      means including integrating means for developing a delayed control pulse in response to the first leading edge of the received pulse or pulses representing each of said data bits and having a duration overlapping the leading edge of the second received pulse of each of said groupings of at least two relatively closely spaced pulses;
      means reconstructing said multibit code in terms of a multibit logic signal comprising said complementary logic state data bit in response to the existence of an overlapping condition between one of said control pulses and a leading edge of the associated received pulse or pulses and otherwise comprising said first logic state data bit; and
      means for decoding said logic signal for controlling said selected television receiver function.

7. The remote control system of claim 6 wherein said encoding means includes means for developing an additional data bit associated with each data bit of said multibit code, each of said additional data bits representing the complementary logic state of its associated data bit, and being transmitted in time succession thereafter, said multibit code including said additional data bits.

8. The remote control system of claim 7 wherein said additional data bits comprise a single pulse representing said first logic state and a grouping of at least two relatively closely spaced pulses representing said second logic state, each of said additional data bits being separated in time from its associated data bit by a predetermined interval.

9. The remote control system of claim 6 wherein said reconstructing means comprises a leading edge triggered multibit shift register having a clock input and a data input, a D-type flip-flop and circuit means coupling said control pulses to the D input of said flip-flop and to the clock input of said shift register, the clock input of said flip-flop being connected for directly receiving said received pulses and the Q output of said flip-flop being connected to the data input of said shift register.

10. The remote control system of claim 9 wherein said receiver includes means responsive to said logic signal for testing the parity of each of said additional data bits with its associated data bit.

11. The remote control system of claim 10 wherein said receiver includes means responsive to said parity testing means and to each of said associated data bits for decoding said logic signal for controlling said selected television receiver function.

12. A system for remotely controlling the operation of one or more consumer electronics apparatus comprising:
    A. a transmitter comprising
       a keyboard for selecting a function of one of said apparatus to be controlled;
       encoding means responsive to said keyboard for developing a multibit code identifying the selected function wherein the data bits forming said multibit code are represented by a single pulse defining a first logic state and a grouping of at least two relatively closely spaced pulses representing the complementary logic state; and
       means for successively transmitting said multibit code as represented by said pulses; and
    B. a receiver comprising
       means for receiving the transmitted pulses forming said multibit code;
       means integrating said received pulses, said integrating means being responsive to the first leading edge of the received pulse or pulses representing each of said data bits of said multibit code for developing a control signal delayed in time with respect thereto and having a duration overlapping the leading edge of the second received pulse of each of said groupings of at least two relatively closely spaced pulses;
       means responsive to said delayed control signals and to said received pulses for developing a multibit logic signal representing the transmitted multibit code, said logic signal comprising said complementary state data bit in response to the existence of an overlapping condition between one of said control signals and a leading edge of the associated received pulse or pulses and otherwise comprising said first state data bit; and
       means for decoding said logic signal for controlling said selected function.

13. A receiver for use in a remote control system of the type wherein a single transmitted pulse represents a first logic state data bit and a grouping of at least two relatively closely spaced transmitted pulses represents the complementary logic state, said receiver comprising:
    means for receiving the transmitted pulses representing said first and complementary state data bits;
    means integrating said received pulses, said integrating means being responsive to the first leading edge of the received pulse or pulses representing each of said bits for developing a control signal delayed in time with respect thereto and having a duration overlapping the leading edge of the second received pulse of each of said groupings of at least two relatively closely spaced pulses; and
    means responsive to said delayed control signals and to said received pulses for developing a multibit logic signal representing the data bits corresponding to said transmitted pulses, said logic signal comprising said complementary state data bit in response to the existence of an overlapping condition between one of said control signals and a leading edge of the associated received pulse or pulses and otherwise comprising said first state data bit.

14. A receiver for use in a remote control system of the type wherein a single transmitted pulse represents a first logic state data bit and a grouping of at least two relatively closely spaced transmitted pulses represents the complementary logic state, said receiver comprising:

means for receiving the transmitted pulses representing said first and complementary state data bits;

means developing a control signal comprising an integrated representation of said received pulses;

a D-type flip-flop having a D input terminal coupled for receiving said control signal and a clock input terminal connected for receiving said received pulses; and a multibit shift register having a clock input terminal coupled for receiving said control signal and a serial data input terminal connected to the Q input of said flip-flop, said shift register developing a logic signal representing the data bits corresponding to said transmitted pulses.

* * * * *